United States Patent [19]

Naji

[11] Patent Number: 6,055,178
[45] Date of Patent: Apr. 25, 2000

[54] MAGNETIC RANDOM ACCESS MEMORY WITH A REFERENCE MEMORY ARRAY

[75] Inventor: Peter K. Naji, Phoenix, Ariz.

[73] Assignee: Motorola, Inc., Schaumburg, Ill.

[21] Appl. No.: 09/215,386

[22] Filed: Dec. 18, 1998

[51] Int. Cl.[7] .................................................. G11C 11/00
[52] U.S. Cl. ........................................... 365/158; 365/171
[58] Field of Search ..................................... 365/158, 171

[56] References Cited

U.S. PATENT DOCUMENTS 5,349,302  9/1994  Cooper .................................... 365/207
5,699,293  12/1997  Tehrani et al. ........................... 365/158

*Primary Examiner*—Richard T. Elms
*Assistant Examiner*—VanThu Nguyen
*Attorney, Agent, or Firm*—William E. Koch

[57] ABSTRACT

An MRAM device (4) includes a memory array and a reference memory array (75). The memory array arranges magnetic memory cells (41, 42) in rows and columns for storing information, and the reference memory array forms reference memory cells (70, 71) for holding a reference information in a row line. The magnetic memory cell has a maximum resistance (R+ΔR) and a minimum resistance (R) according to magnetic states in the cell. Each reference memory cell has a magnetic memory cell (70, 71) and a transistor (72, 73), which are coupled in series and have a reference resistance across the reference memory cell and the transistor. The transistor is controlled by a reference row line control (74), so as for the reference resistance to show a mid-value between the maximum resistance and the minimum resistance of the magnetic memory cell. A bit line current (Ib) and a reference bit current (Ir) are provided to the magnetic memory cell and the reference memory cell, respectively. Magnetic states alternates the bit line current, which is compared to the reference bit current to provide an output.

24 Claims, 3 Drawing Sheets

MAGNETIC RANDOM ACCESS MEMORY WITH A REFERENCE MEMORY ARRAY

FIELD OF THE INVENTION

The present invention relates to a magnetic random access memory, and more particularly, to a magnetic random access memory with a reference memory array.

BACKGROUND OF THE INVENTION

A magnetoresistive random access memory (MRAM), which is one of non-volatile memory devices, includes a plurality of magnetic memory cells. It is known that the magnetoresistive effect appears in multi-layer films that are alternately stacked by magnetic layers and non-magnetic layers. Magnetic resistance over a magnetic memory cell indicates minimum and maximum values when magnetization vectors in magnetic layers point in the same or opposite directions, respectively. The same and opposite directions of magnetization vectors in two magnetic layers are called "Parallel" and "Anti-parallel" states, respectively. When magnetic material is employed for a memory device, Parallel and Anti-parallel directions, for example, are logically defined as "0" and "1" states, respectively. The magnetization vectors in magnetic layers are very quickly switched to another direction by an application of a magnetic field over a switching point, and maintain the magnetization direction even without a magnetic field.

The MRAM device normally has magnetic memory cells arranged on intersections of metal lines, which are placed in rows and columns. The MRAM circuit, for instance, is described in a co-pending U.S. patent application Ser. No. 09/128,020 entitled "MAGNETIC RANDOM ACCESS MEMORY ARRAY DIVIDED INTO A PLURALITY OF MEMORY BANKS," filed Aug. 3, 1998 assigned to the same assignee. This patent teaches an MRAM bank that has bit lines, a reference line, and digit lines. The reference line is placed parallel with bit lines and perpendicular to digit lines. On each intersection of these lines, memory cells and reference cells are arranged in rows and columns. The reference cell is employed to sense states stored in the memory cell.

The MRAM device generally is formed on a substrate such as a semiconductor or glass. Magnetic and non-magnetic layers are sequentially deposited on the substrate and etched to form magnetic memory cells, which are 0.2 $\mu$m by 0.3 $\mu$m in size, for instance. The magnetic layer usually has a 10–100 Å thickness while the non-magnetic layer is 10–30 Å thick. The MRAM device includes magnetic memory cells for storing specific information, and reference magnetic memory cells where a reference state is maintained. In order to read states stored in a magnetic memory cell (active or target cell), a sense current and a reference current are applied to the target cell and a reference magnetic memory cell (reference cell), respectively. The target and reference cells generate voltage drops across the cells that correspond to magnetic resistance values of the target and reference cells, respectively. These voltages are compared to each other to determine states in the target cell. Therefore, it is desirable to provide an MRAM device that has magnetic memory cells without relative variations of the magnetic resistance to correctly compare a target cell to a reference cell.

Accordingly, it is a purpose of the present invention to provide an improved MRAM device that has a high-speed, high-density, and low power memory.

It is another purpose of the present invention to provide an improved MRAM device that has a high reliability reading process.

It is still another purpose of the present invention to provide an improved MRAM device that reduces variations of the magnetic resistance in magnetic memory cells.

SUMMARY OF THE INVENTION

These needs and others are substantially met through provision of a magnetoresistive random access memory (MRAM) device that includes a reference memory array. The MRAM device has a plurality of magnetic memory cells placed on intersections of bit lines and digit lines. The reference memory array has a plurality of reference cells and resistive elements. Each reference cell is coupled in series to a resistive element. A total resistance across the reference cell and the resistive element is set to a resistance between a maximum resistance and a minimum resistance of the target cell, thereby it is possible to compare the magnetic resistance of the target cell to one of the reference cell to provide an output. The total resistance is typically a midpoint between maximum and minimum resistance values.

DETAILED DESCRIPTION OF THE PREFERRED EMBODIMENTS

Figure 1:
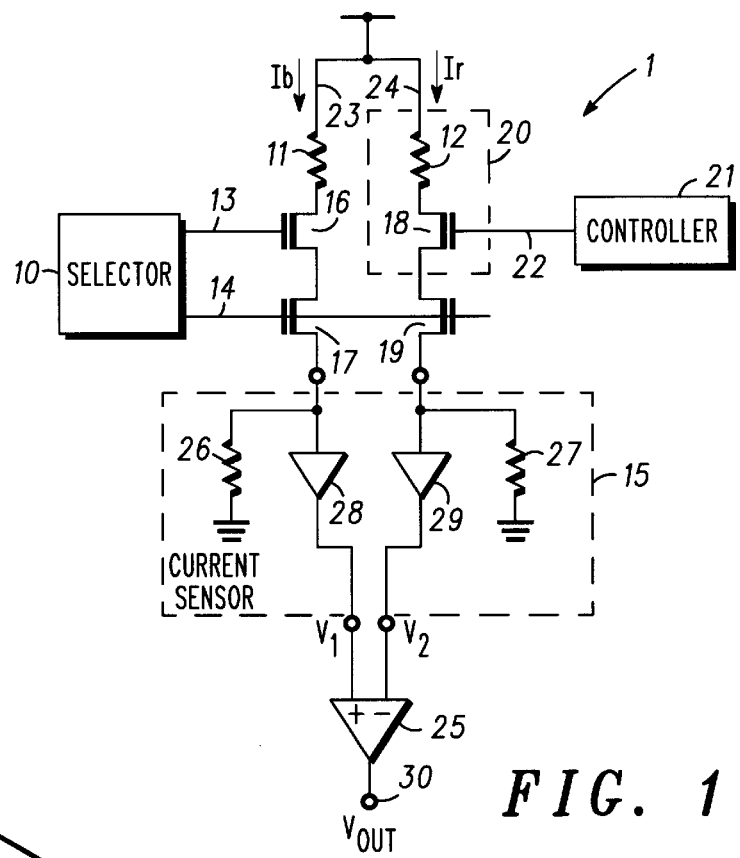
FIG. 1 shows a basic circuit formed in an MRAM device on a reading mode.

FIG. 1 shows a basic circuit 1 illustrating a reading operation in an MRAM device. A selector 10 selects a target magnetic memory cell (target cell) 11 and a reference magnetic memory cell (reference cell) 12, which are asserted by a word line 13 and a bit line 14. These cells are the same structure, each having magnetic layers separated by a non-magnetic layer. The structure and its characteristics are described in FIGS. 2 and 3, and the detail will be explained hereinafter. Target cell 11 is coupled in series to a current sensor 15 through switching transistors 16 and 17 while reference cell 12 is coupled in series to current sensor 15 through a transistor 18 and a switching transistor 19. Reference cell 12 and transistor 18 form a reference element 20. A reference element controller 21 is connected to transistor 18 through reference row line 22, on which a resistance control signal is provided to determine a drain-source resistance of transistor 18. Current sensor 15 detects a bit current Ib on a bit line 23 and a reference current Ir on a reference bit line 24 and converts to voltages V1 and V2, respectively. Voltages V1 and V2 are applied to positive and negative inputs of a comparator 25, respectively. As shown in FIG. 1, current sensor 15, for example, is formed by resistors 26 and 27 and amplifiers 28 and 29. Bit current Ib flowing in resistor 26 generates a voltage drop across resistor 26, which is amplified by amplifier 28 to produce voltage V1. Current Ir is converted to V2 in the same way as current Ib. Outputs of current sensor 15 are coupled to comparator 25 where voltages V1 and V2 are compared to provide an output voltage Vout on an output terminal 30.

Figure 2:
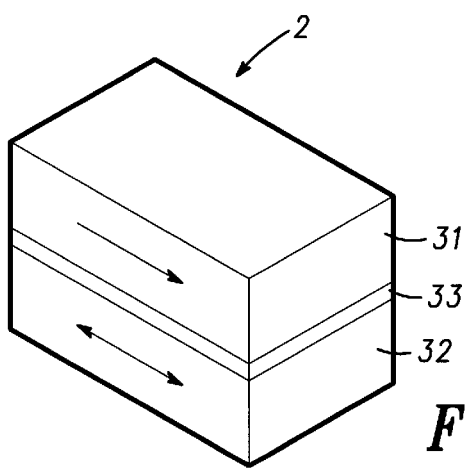
FIG. 2 shows a simplified and enlarged magnetic memory cell with magnetic layers separated by a non-magnetic layer.
Figure 3:
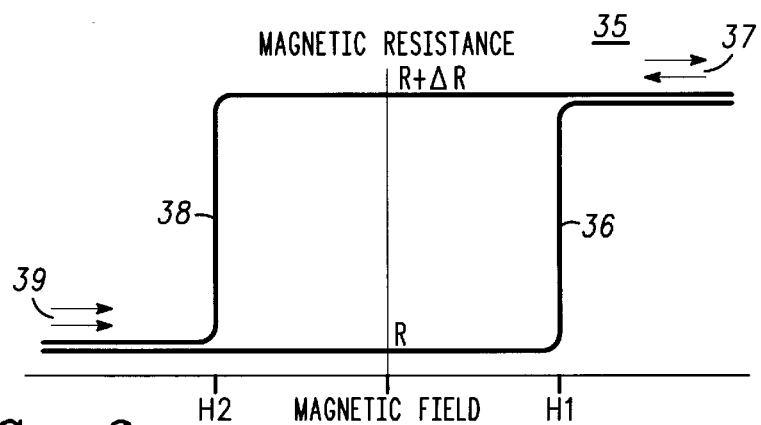
FIG. 3 shows a graph illustrating hysteresis characteristics of the magnetic memory cell described in FIG. 2.

FIGS. 2 and 3 show an isometric view of a simplified and enlarged magnetic memory cell 2, and hysteresis characteristics 35 of cell 2 in FIG. 2, respectively. It should be noted that other types of magnetic memory cells can be employed for the memory device. Cell 2 has three layers that include first and second magnetic layers 31 and 32 separated by a non-magnetic layer 33. First and second magnetic layers 31 and 32 use magnetic material such as CoFe and NiFeCo. Magnetization vectors in first magnetic layer 31, for example, are magnetically pinned by an antiferromagnetic layer (not shown) that is placed adjacent layer 31. Second magnetic layer 32, which is magnetically free, alternates magnetization vectors responding to an external magnetic field. Non-magnetic layer 33, for example, is formed by an insulating material such as $Al_2O_3$ and has a thickness of around 20 Å. The thin thickness allows non-magnetic layer 33 to form a tunneling junction between first and second magnetic layers 31 and 32, through which a tunneling current flows. As will be seen in FIG. 3, a magnetic resistance of the memory cell changes according to directions of magnetization in second magnetic layer 32 that causes a tunneling current in non-magnetic layer 33 to vary. The magnetic layers would be patterned to substantially align the magnetization as shown in U.S. Pat. No. 5,757,695.

Referring to FIG. 3 again, the abscissa of FIG. 3 indicates a direction and strength of a magnetic field applied to cell 2. The ordinate represents the magnetic resistance of the cell 2. Assuming cell 2 is in the state that magnetization vectors in layers 31 and 32 point in the Parallel state (same direction) under no external magnetic field, the external magnetic field changes to a value H1 moving to the right along the abscissa. As shown by curve 36, magnetization vectors in second magnetic (free) layer 32 are switched to the left at a magnetic field H1 and magnetization vectors in layers 31 and 32 are oriented in the Anti-parallel state (opposite direction) as indicated by arrows 37. Consequently, a magnetic resistance of cell 2 increases from R by ΔR. Next changing the magnetic field from H1 as shown by curve 38, magnetization vectors in second magnetic layer 32 are switched at a magnetic field H2 to the right. Consequently the magnetic resistance is lowered to R by ΔR and magnetization vectors in layers 31 and 32 point in the Parallel direction as indicated by arrows 39. An example of the memory cell structure is shown in U.S. Pat. No. 5,768,181.

Referring to FIG. 1 again, selector 10 provides a word signal on word line 13 and a bit signal on bit line 14, which allow switching transistors 16, 17, and 19 to turn on and bit current Ib to flow in target cell 11. Target cell 11 determines a magnitude of current Ib, which depends on magnetic states stored in target cell 11. Reference element controller 21 provides a resistance control signal on reference row line 22 to control a drain-source resistance of transistor 18. In order for comparator 25 to compare states in target cell 11 to states in reference cell 12, transistor 18 establishes a total resistance across reference element 20 between a maximum resistance (R+ΔR) and a minimum resistance (R) of target cell 11, which typically is a mid-point resistance value that is equal to R+ΔR/2. Current Ib and current Ir are converted to voltages V1 and V2, respectively, which are compared at comparator 25 to provide output voltage Vout at output terminal 30. When current Ib is smaller than current Ir, that is, voltage V1 is lower than voltage V2, comparator 25 gives a low voltage at terminal 30, which means target cell 11 has a maximum resistance (R+ΔR) and is in the "Antiparallel" state. On the contrary, when voltage V1 is higher than voltage V2, comparator 22 provides a high voltage at terminal 30, which means target cell 11 has a minimum resistance (R) and is in the "Parallel" state.

As mentioned earlier, transistor 18 is controlled for the total resistance of reference cell 12 and transistor 18 to create a resistance between the maximum and the minimum resistances of the magnetic memory cell. That enables comparator 25 to determine magnetic states stored in target cell 11.

Figure 4:
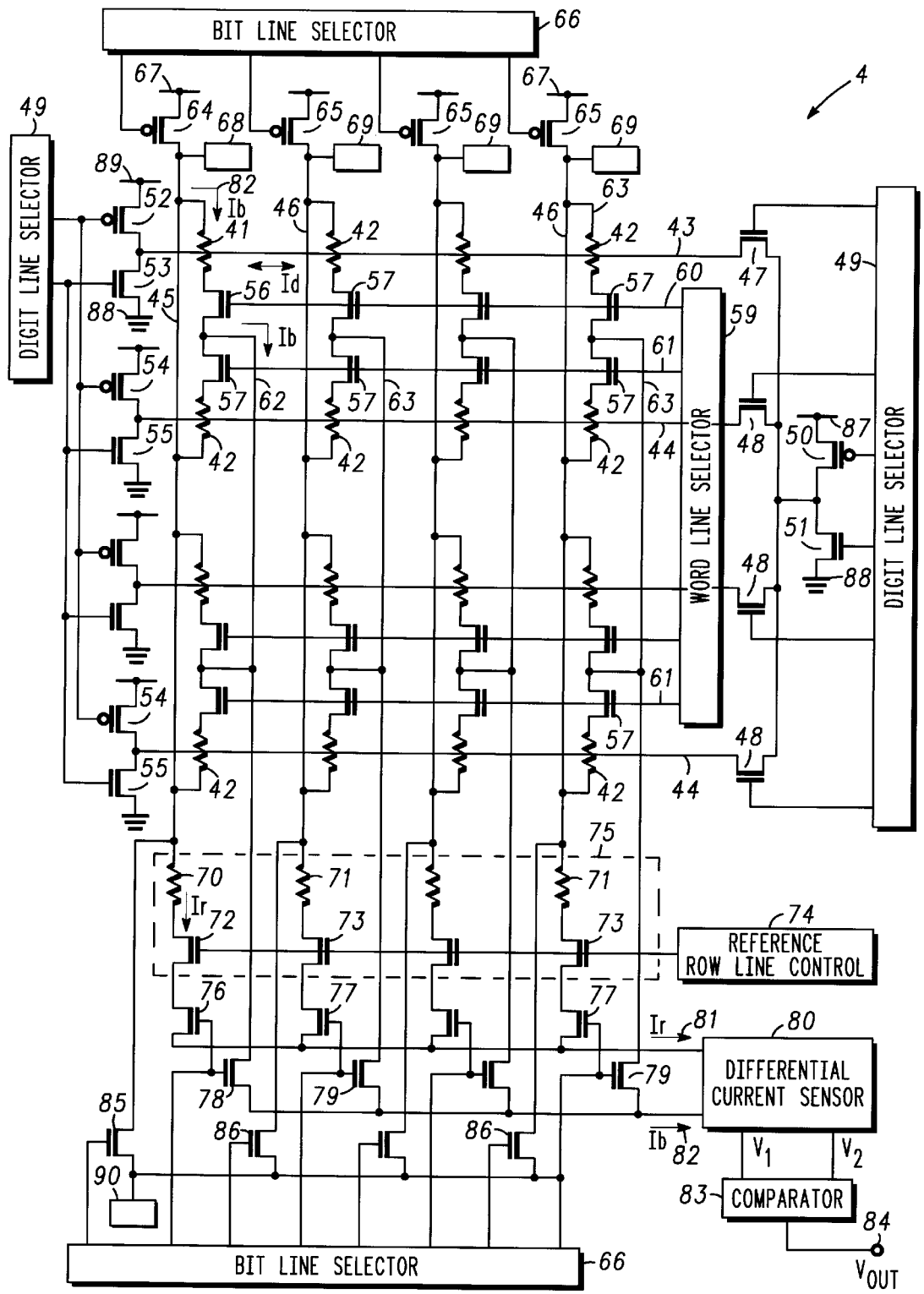
FIG. 4 shows an MRAM device circuit.

Referring to FIG. 4, a circuit 4 for an MRAM device is described. A plurality of magnetic memory cells 41 and 42 are placed in rows and columns on intersections of digit lines 43 and 44 and reference bit lines 45 and 46. Digit lines 43 and 44 are coupled to transistors 47 and 48 and transistors 50–55, respectively. A digit line selector activates one of digit lines 43 and 44, and determines directions of the digit current. Pairs of transistors 50 and 51, 52 and 53, and 54 and 55 determine current directions of the digit current. Cells 41 and 42 are coupled in series to switching transistors 56 and 57, respectively. Gate electrodes of transistors 56 and 57 are coupled to word line selector through word lines 60 and 61.

Reference bit lines 45 and 46 are placed perpendicularly to digit lines 43 and 44, which are coupled to transistors 64–65, respectively. Gate electrodes of transistors 64 and 65 are coupled together to bit line selector 66, while drain electrodes of transistors 64 and 65 are coupled to a power line 67. Programming current sources 68 and 69, which supply a writing current to a magnetic memory cell, are coupled to reference bit lines 45 and 46, respectively.

Reference bit lines 45 and 46 further are coupled to reference magnetic memory cells (reference cells) 70 and 71, which have the same memory structure as cells 41 and 42. Reference cells 70 and 71 are coupled in series to transistors 72 and 73, respectively. Gate electrodes of transistors 72 and 73 are linked together to a reference row line control 74 that controls a drain-source resistive value of transistors 72 and 73. Reference cells 70 and 71 and transistors 72 and 73 form a row line memory array 75 as shown by a dashed line. Reference cells 70 and 71 are equivalent to reference cell 12 in FIG. 1 while transistors 72 and 73 are equivalent to transistor 18. Transistors 72 and 73 are coupled to transistors 76 and 77, respectively. Bit lines 62 and 63 are coupled in series to transistors 78 and 79, respectively. Source electrodes of transistors 76 and 77 are connected together to current sensor 80 to provided a reference current Ir indicated by an arrow 81 and also source electrodes of transistors 78 and 79 are connected together to current sensor 80 to provide a bit current Ib expressed by an arrow 82. Outputs of sensor 80 are coupled to comparator 83 to provide an output voltage Vout at an output terminal 84. Current sensor 80 and comparator 83 are equivalent to sensor 15 and comparator 22 in FIG. 1. Transistors 85 and 86, which are controlled by bit line selector 66 on a writing mode, are coupled to reference bit lines 45 and 46, respectively.

Next, a reading mode is carried out according to the following steps, which sense target cell 41, for example. First, word line selector 59 provides a word signal on word line 60 in order to turn transistor 56 on. Reference row line control 74 sends a resistance control signal to transistor 72, which gives a mid-point resistance value (that is equal to R+ΔR/2) across reference cell 70 and transistor 72. Finally bit line selector 66 applies a signal to turn on transistor 76 and 78, and a signal for activating reference bit line 45 to transistor 64, thereby transistors 64, 76, and 78 are all turned on. Consequently, activation of transistors 56, 64, 72, 76, and 78 forms the same circuit in MRAM device circuit 4 as the basic circuit of FIG. 1, and allows bit current Ib and reference bit current Ir to flow in bit line 62 and reference bit line 45. That is, bit current Ib flows from power line 67 through transistor 64, target cell 41, transistors 56 and 78 to current sensor 80, and reference bit current Ir flows from power line 67 through transistor 64, cell 81, transistors 72 and 76 to current sensor 80.

As mentioned earlier in FIG. 1, bit current Ib and refernce bit current Ir change based on states stored in cell 41. Current sensor 80 converts these currents Ib and Ir to voltages V1 and V2, respectively, which go to comparator 83. Comparator 83 compares voltage V1 to voltage V2 to give an output voltage Vout at output terminal 84. Generally, output terminal 84 is coupled to a data bus (not shown in FIG. 4) in a computer system.

In order to write states in a magnetic memory cell, a digit current and a bit current are applied to a digit line and a reference bit line. The digit current and the bit current generate magnetic fields, respectively, a combined magnetic field of which is sufficient enough to change states in the cell. Directions of the combined magnetic field determine states to be stored in the cell. When cell 41, for example, is accessed to write states, digit line selector 49 turns transistor 47 on to activate digit line 43 and bit line selector 66 turns transistor 85 on to activate reference bit line 45. Transistors 56, 64, 76, and 78 are all turned off to prohibit from flowing a current into cell 41. Turning on transistor 85 allows the bit current to flow from current source 68 through reference bit line 45 and transistor 85 to a current sink 90. The bit current contributes half of the combined magnetic field. Digit line selector 49 not only provides the digit current on digit line 43 but determines current directions according to states to be stored in cell 41. The digit current supports to produce another half of the combined magnetic field.

When a logic "0" is written in cell 41, digit line selector 49 turns transistors 50 and 53 on and transistors 51 and 52 off, thereby a digit current Id flows from a power line 87 through transistors 50 and 47, digit line 43 and transistor 53 to common line 88. Digit current Id allows the combined magnetic field to make the "Parallel" state in cell 41. Alternatively, when a logic "1" is stored in cell 41, transistors 51 and 52 are turned on and transistors 50 and 53 are turned off. Consequently, digit current Id is provided on digit line 43 from a power line 89 through transistors 52, digit line 43 and transistors 47 and 51 to common line 87. This digit current supports the combined magnetic field to form the "Antiparallel" state in cell 41.

Figure 5:
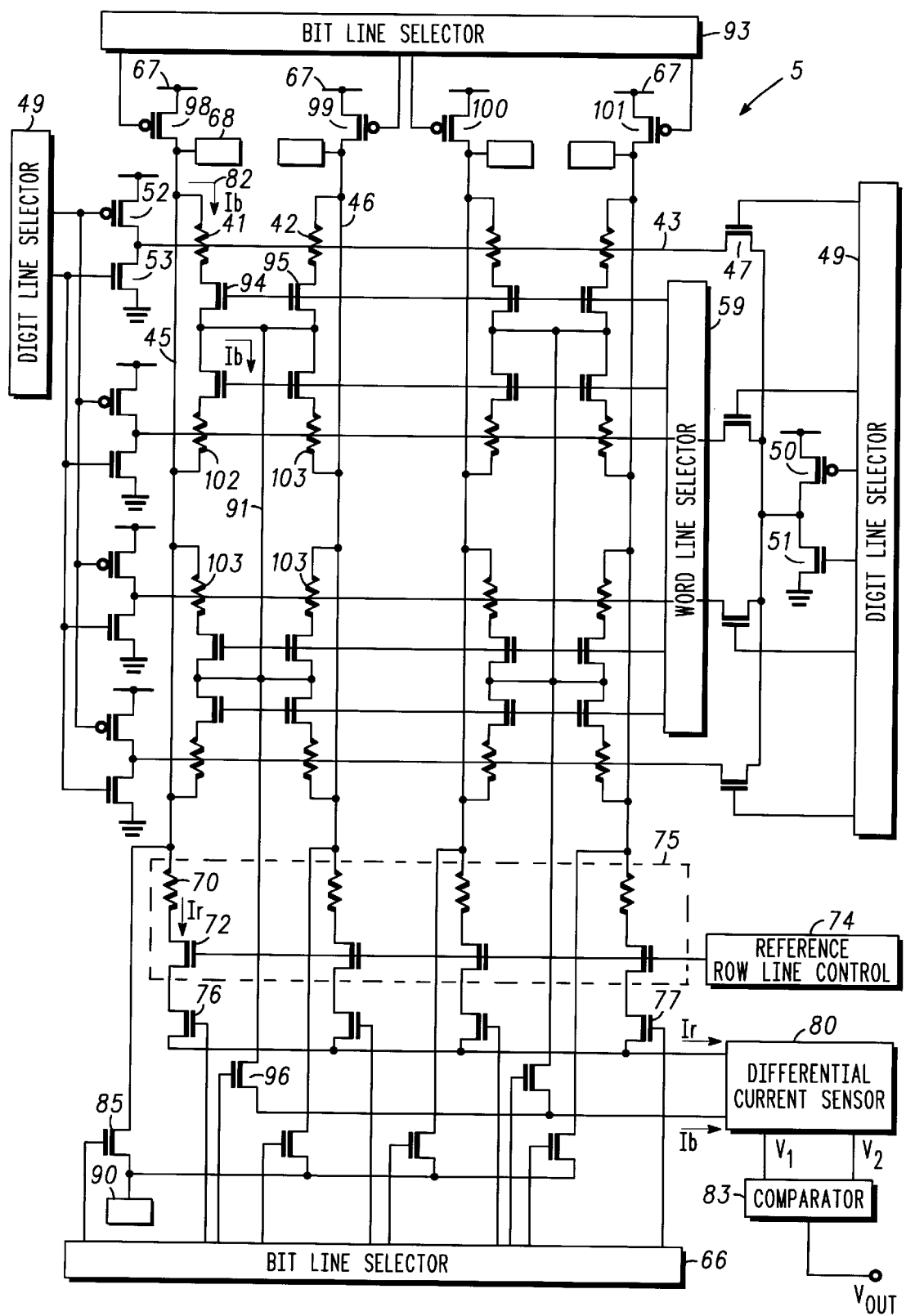
FIG. 5 shows an another MRAM device circuit.

Referring to FIG. 5, another type of MRAM circuit 5 is illustrated. MRAM circuit 5 is the same as circuit 4 except shared bit lines 91 and 92, and a bit line selector 93. Since MRAM circuit 5 includes shared bit lines, it attains MRAM device having less chip area and higher density. Portions of FIG. 5 that have the same reference numbers as FIG. 4 are the same as the corresponding elements in FIG. 4. Description for the same circuit configuration is omitted for simplicity.

Source electrodes of transistors 94 and 95, which correspond to transistor 75 in FIG. 4, are connected together to shared bit lines 91. Transistor 96 connects shared bit line 91 to differential current sensor 80 while shared bit line 92 coupled to differential current sensor 80 through transistor 97. Bit line selector 93 selects one of transistors 98–101 to provide a bit current and a reference bit current.

In an operation for reading memory cell 41, for instance, bit line selector 66 and 93 turn transistors 76, 96 and 98 on. At the same time word line selector 59 provides a word line signal to transistor 94, while reference row line control 74 sends a reference row line signal to transistor 72. Turning on transistors 98, 94, and 96 allows bit current Ib indicated by arrow 82 to flow from power line 67 through transistor 98, cell 41, transistor 94, shared bit line 91 and transistor 96 to differential current sensor 80. And also reference bit current Ir expressed by arrow 81 is provided in reference cell 70, which flows through transistors 72 and 76 into current sensor 80.

As mentioned earlier, differential current sensor 80 senses both currents Ib and Ir, and converts them to voltages V1 and V2, respectively. Comparator 83 compares voltages V1 and V2 to provide output voltage Vout at output terminal 84 that corresponds to magnetic states stored in magnetic cell 41.

Next, in order to read states in memory cell 42, transistors 99, 95, and 96 are turned on, thereby a bit current flows from power line 67 through transistor 99, cell 42, transistor 95, shared bit line 91, and transistor 96 to current sensor 80. That is, shared bit line 91 is employed to sense not only cell 41 but cell 42. Further, magnetic memory cells 102 and 103 also use shared bit line 91 to provide a bit current from power line 67 to current sensor 80.

In order to store states in memory cell 41, for example, bit line selector 66 turns on transistor 85 to access reference bit line 45, which allows current source 68 to provide a bit current on reference bit line 45 to current sink 90. Further, digit line selector 49 controls transistors 47, 50–53 to give a digit current on digit line 43. These steps are the same process as described earlier for circuit 4 illustrated in FIG. 4.

Thus, a new and improved MRAM device has been fully disclosed, which includes a reference memory array in a row line. The reference memory array compensate and eliminate relative resistance variations of magnetic memory cells, which provides a steady reading function, high speed and high reliability.

What is claimed is:

1. A magnetic random access memory comprising:

a first electrically conductive line;

a magnetic memory cell coupled in series to the first electrically conductive line, the magnetic memory cell having a magnetic resistance that is switched between a minimum magnetic resistance and a maximum magnetic resistance according to directions of magnetization vectors stored in the magnetic memory cell;

a second electrically conductive line;

a reference magnetic memory cell coupled in series to the second electrically conductive line, the reference magnetic memory cell having a predetermined magnetic resistance; and a resistive element coupled in series to the reference magnetic memory cell, a total resistance across the reference magnetic memory cell and the resistive element being set between the minimum magnetic resistance and the maximum magnetic resistance.

2. The magnetic random access memory as claimed in claim 1 further including a comparator having a first input and a second input, the first input being coupled to the first electrically conductive line and the second input being coupled to the second electrically conductive line, for comparing the magnetic resistance to the total resistance to provide an output.

3. The magnetic random access memory as claimed in claim 2 wherein the comparator includes:

a converter for converting a first current on the first electrically conductive line and a second current on the second electrically conductive line to a first voltage and a second voltage, respectively; and a voltage comparator for comparing the first voltage to the second voltage to provide the output.

4. The magnetic random access memory as claimed in claim 1 wherein the resistive element is a transistor, which allows the total resistance to be set between the minimum magnetic resistance and the maximum magnetic resistance.

5. The magnetic random access memory as claimed in claim 1 wherein the resistive element is set so as for the total resistance to be a mid-point resistance between the minimum magnetic resistance and the maximum magnetic resistance.

6. The magnetic random access memory as claimed in claim 1 further including a first switch coupled in series to the first electrically conductive line for enabling the magnetic memory cell to be active, and a second switch coupled in series to the second electrically conductive line for enabling the reference magnetic memory cell to be active.

7. The magnetic random access memory as claimed in claim 1 wherein the magnetic memory cell and the reference magnetic memory cell have magnetic layers separated by a non-magnetic layer.

8. A magnetic random access memory device comprising:
   a plurality of magnetic memory cells placed in rows and columns;
   a plurality of reference magnetic memory cells;
   a plurality of resistive elements, each resistive element being electrically coupled in series to a reference magnetic memory cell;
   a selector for selecting a target memory cell being one of the plurality of magnetic memory cells, and a reference memory cell being one of the plurality of reference magnetic memory cells; and
   a comparator for comparing a resistive value across the target memory cell to a total resistive value across the reference memory cell and a resistive element coupled to the reference memory cell to provide an output signal.

9. The magnetic random access memory device as claimed in claim 8 wherein the plurality of magnetic memory cells are placed on intersections of a plurality of bit lines and a plurality of digit lines.

10. The magnetic random access memory device as claimed in claim 8 wherein the comparator has a first input and a second input, the first and second inputs being electrically coupled to the target memory cell and the reference memory cell, respectively.

11. The magnetic random access memory device as claimed in claim 8 wherein each of the plurality of magnetic memory cells has a minimum resistive value and a maximum resistive value, and the total resistive value is set between the minimum resistive value and the maximum resistive value.

12. The magnetic random access memory device as claimed in claim 11 wherein the total resistive value is a mid-point resistive value between the minimum resistive value and the maximum resistive value.

13. The magnetic random access memory device as claimed in claim 12 wherein the resistive element is a transistor having a gate electrode, the total resistive value being set by a reference signal applied to the gate electrode.

14. The magnetic random access memory device as claimed in claim 8 wherein the magnetic memory cell and the reference magnetic memory cell have magnetic layers separated by a non-magnetic layer.

15. A magnetic random access memory device comprising:
   a memory array including:
      a plurality of bit lines, each bit line being electrically conductive;
      a plurality of digit lines, each digit line being electrically conductive and perpendicularly placed to the bit lines; and
      a plurality of magnetic memory cells, each magnetic memory cell being placed on each intersection of the plurality of bit lines and the plurality of digit lines, and being electrically coupled in series to the bit line; and
   a reference memory array including:
      a reference line being electrically conductive;
      a plurality of reference bit lines, each reference bit line being electrically conductive;
      a plurality of reference magnetic memory cells, each reference magnetic memory cell being electrically coupled in series to the each reference bit line; and
      a plurality of resistive elements, each resistive element being electrically coupled in series to a reference magnetic memory cell and being electrically coupled to the reference line.

16. The magnetic random access memory device as claimed in claim 15 wherein each of the plurality of magnetic memory cells has a minimum resistive value and a maximum resistive value, and a total resistive value across the reference magnetic memory cell and a resistive element is set between the minimum resistive value and the maximum resistive value.

17. The magnetic random access memory device as claimed in claim 16 wherein the total resistive value is a mid-point resistive value between the minimum resistive value and the maximum resistive value.

18. The magnetic random access memory device as claimed in claim 17 wherein the resistive element is a transistor having a gate electrode, the total resistive value being set by a reference signal applied to the gate electrode.

19. The magnetic random access memory device as claimed in claim 15 wherein the magnetic memory cell and the reference magnetic memory cell have magnetic layers separated by a non-magnetic layer.

20. A magnetic random access memory device comprising:
   a plurality of memory banks including:
      a couple of bit lines being coupled to a shared bit line and electrically conductive;
      a plurality of digit lines, each digit line being perpendicularly placed to the bit lines and electrically conductive; and
      a plurality of magnetic memory cells, one each magnetic memory cell being placed on each intersection of the couple of bit lines and the plurality of digit lines, and being electrically coupled to said shared bit line; and
   a reference memory array including:
      a reference line being electrically conductive;
      a plurality of reference bit lines, each reference bit line being electrically conductive;
      a plurality of reference magnetic memory cells, each reference magnetic memory cell being electrically coupled in series to the each reference bit line; and
      a plurality of resistive elements, each resistive element being electrically coupled in series to a reference magnetic memory cell and being electrically coupled to the reference line; and
   a comparator having a first input, and a second input, the first input being coupled to shared bit lines in the plurality of memory banks and the second input being coupled to the plurality of reference bit lines.

21. The magnetic random access memory device as claimed in claim 20 wherein each of the plurality of magnetic memory cells has a minimum resistive value and a maximum resistive value, and a total resistive value is set between the minimum resistive value and the maximum resistive value.

22. The magnetic random access memory device as claimed in claim 21 wherein the total resistive value is a mid-point resistive value between the minimum resistive value and the maximum resistive value.

23. The magnetic random access memory device as claimed in claim 22 wherein the resistive element is a transistor having a gate electrode, the total resistive value being set by a reference signal applied to the gate electrode.

24. The magnetic random access memory device as claimed in claim 20 wherein the magnetic memory cell and the reference magnetic memory cell have magnetic layers separated by a non-magnetic layer.

* * * * *

UNITED STATES PATENT AND TRADEMARK OFFICE
CERTIFICATE OF CORRECTION

PATENT NO. : 6,055,178
DATED : April 25, 2000
INVENTOR(S) : Naji

It is certified that error appears in the above-identified patent and that said Letters Patent is hereby corrected as shown below:

Column 1,
Line 3, after the Title, please add as a new first paragraph the following paragraph:
 -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*